United States Patent [19]
Gil

[11] Patent Number: 6,165,829
[45] Date of Patent: Dec. 26, 2000

[54] THIN FILM TRANSISTOR AND FABRICATION METHOD THEREFOR

[75] Inventor: Gyoung-Seon Gil, Koonsan, Rep. of Korea

[73] Assignee: Hyundai Electronics Industries Co., Ltd., Kyoungki-do, Rep. of Korea

[21] Appl. No.: 09/139,266

[22] Filed: Aug. 25, 1998

[30] Foreign Application Priority Data

Dec. 17, 1997 [KR] Rep. of Korea ............. 97-70069

[51] Int. Cl.[7] .................................... H01L 21/8244
[52] U.S. Cl. .................. 438/238; 438/239; 438/240; 438/241; 257/308; 257/309
[58] Field of Search .................. 438/238, 239, 438/240, 241, 242, 395, 394, 396, 397; 257/308, 309, 310, 311, 329, 330, 331

[56] References Cited

U.S. PATENT DOCUMENTS

| | | | |
|---|---|---|---|
| 4,767,695 | 8/1988 | Ong et al. | 430/311 |
| 5,243,219 | 9/1993 | Katayama | 287/740 |
| 5,578,838 | 11/1996 | Cho et al. | |
| 5,659,183 | 8/1997 | Manning et al. | |
| 5,705,409 | 1/1998 | Witek | 437/35 |
| 5,731,610 | 3/1998 | Rhodes | 257/309 |
| 5,793,082 | 8/1998 | Bryant | 257/330 |
| 5,807,778 | 1/1998 | Lee | 438/257 |
| 5,827,770 | 10/1998 | Phodes et al. | 438/396 |
| 5,879,980 | 3/1999 | Selcuk et al. | 438/238 |

FOREIGN PATENT DOCUMENTS

| | | | |
|---|---|---|---|
| 06029619 | 7/1992 | Japan | 3/18 |
| 0629620 | 7/1992 | Japan | 3/18 |

*Primary Examiner*—Charles Bowers
*Assistant Examiner*—Laura M Schillinger

[57] ABSTRACT

A thin film transistor and a fabrication method therefor, which thin transistor includes: a stepped substrate provided with a sidewall between upper portion and lower portions thereof; an active layer formed on the substrate; a gate insulation film on the active layer; a gate electrode formed on the gate insulation film corresponding to an upper part of the sidewall of the substrate; an insulation film formed on a part of the gate insulation film between the gate electrode and the lower portion of the substrate; and impurity regions formed in the active layer corresponding to the upper and lower portions of the substrate. The impurity regions are formed by a self-aligned process using an additional mask, which controls the length of channel and offset regions in accordance with the thicknesses of the gate electrode and insulation film, respectively, for thus obtaining a more stabilized offset current and accordingly improving the reliability and reproducibility of the semiconductor device.

6 Claims, 5 Drawing Sheets

THIN FILM TRANSISTOR AND FABRICATION METHOD THEREFOR

BACKGROUND OF THE INVENTION

1. Field of the Invention

The present invention relates to a semiconductor device, and more particularly to a thin film transistor and a fabrication method therefor applying a self-aligned process.

2. Description of the Conventional Art

In a conventional thin film transistor, when a gate electrode receives a voltage which is greater than a threshold voltage, and when a drain electrode receives a voltage greater than a source voltage, electrons, majority carriers in a source region, are migrated to a drain region via a channel region formed in a polysilicon layer, and thus a driving current is made to flow. However, when forming the channel region by applying the voltage to the gate electrode, the mobility of majority carriers is lowered due to a potential barrier formed by grain boundaries inside the polysilicon layer, and thus the driving current is reduced in a turn-on state.

Accordingly, there is provided an offset region of low resistance in the channel region at a side of the drain region in order to reduce the leakage current. A method of fabricating the conventional thin film transistor will now be described with reference to the appended drawings.

As shown in FIG. 1A, a polysilicon layer is deposited on an insulating substrate 1 by chemical vapor deposition (CVD), and patterned by a photo etching process, applying the polysilicon layer as a gate mask, for thus forming a gate electrode 2.

As shown in FIG. 1B, a gate insulation film 3 is formed by depositing an insulating material on the surface of the insulating substrate 1 including the gate electrode 2, and an active layer 4 is deposited thereon by CVD.

A photoresist is applied on the active layer 4 and patterned by a photo etching process, for thus forming a photoresist pattern 5 as shown in FIG. 1C. Here, the photoresist pattern 5 defines channel and offset regions of the active layer 4.

As shown in FIGS. 1C and 1D, impurity regions 6a and 6b are formed by performing ion implantation, applying P or N-type impurities, into parts of the active layer 4 which are externally exposed, for thereby completing the fabrication of the conventional thin film transistor.

The impurity regions 6a and 6b define a source (a) and a drain (d), respectively, of a MOS transistor. In FIG. 1D, a, b, c, and d indicate the source, channel region, offset region, and drain, respectively.

However, a photomask process of the conventional method, which defines the length of each of the channel and offset regions, varies an offset current, which is dependent upon the degree of alignment, on a large scale, thereby reducing the reliability and reproducibility of the semiconductor device.

SUMMARY OF THE INVENTION

Accordingly, it is an object of the present invention to provide a thin film transistor and a fabrication method therefor capable of stabilizing an offset current which is dependent upon the degree of alignment by providing a self-aligned process, and thus improving properties of a semiconductor device.

To achieve the above objects, there is provided a thin film transistor which includes: a stepped substrate provided with a sidewall between upper portion and lower portions thereof; an active layer formed on the substrate; a gate insulation film on the active layer; a gate electrode formed on the gate insulation film corresponding to an upper part of the sidewall of the substrate; an insulation film formed on the gate insulation film between the gate electrode and the lower portion of the substrate; and impurity regions in the active layer corresponding to the upper and lower portions of the substrate.

In addition, to achieve the above objects, there is provided a fabrication method for a thin film transistor which includes the steps of: etching and patterning in order to form a sidewall between upper and lower portions thereof; forming an active layer on the substrate; forming a gate insulation film on the active layer; forming an insulation film on a first region of the sidewall and on the lower portion of the substrate, and forming a gate electrode on a second region of the sidewall and on the insulation film; and forming impurity regions in the active layer corresponding to the upper and lower portions of the substrate.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

With reference to the appended drawings, the thin film transistor according to the present invention and a fabrication method thereof will now be described.

Figure 1A:
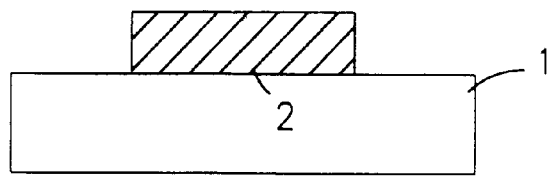
FIGS. 1A–1D are vertical cross-sectional diagrams sequentially illustrating a conventional method of fabricating a thin film transistor.
Figure 1B:
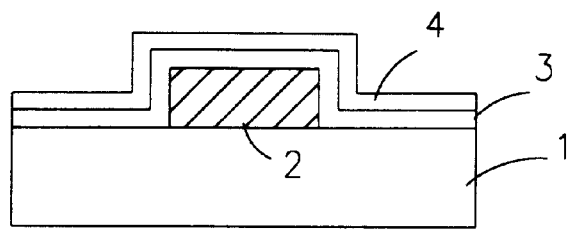
Figure 1C:
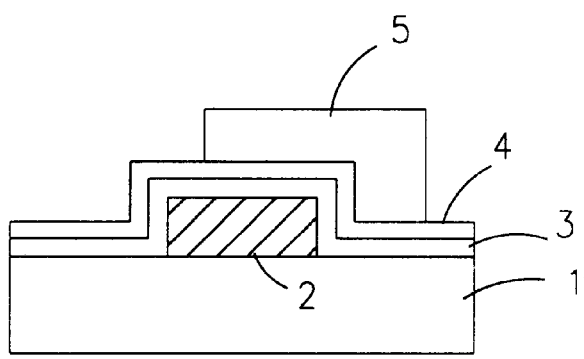
Figure 1D:
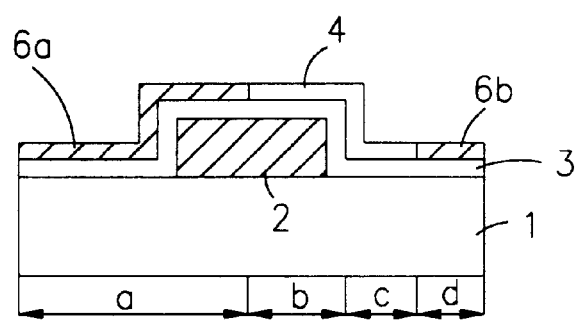
Figure 2:
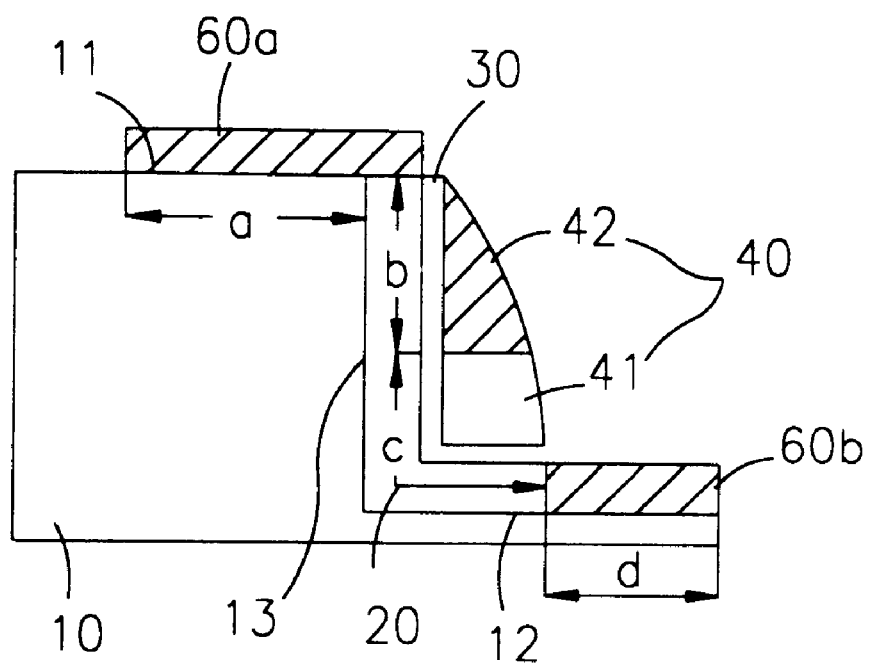
FIG. 2 is a vertical cross-sectional view of a thin film transistor according to the present invention.

FIG. 2 is a vertical cross-sectional view of a thin film transistor according to the present invention. As shown therein, a substrate 10 has a step formed on an upper surface thereof, and thus is provided with upper and lower portions 11, 12, and a sidewall 13 therebetween. An active layer 20 is formed on the upper and lower portions 11, 12, and on the sidewall 13. A gate insulation film 30 is formed on a part of the active layer 20 corresponding to the lower portion 12 and on a part of the active layer 20 corresponding to the sidewall 13. A gate electrode 42 is formed on the gate insulation film 30 corresponding to an upper part of the sidewall 13, and an insulation film 41 is formed on a part of the gate insulation film 30 corresponding to the lower portion 12 of the substrate 10 and on a part of the gate insulation film 30 corresponding to a lower part of the sidewall 13 of the substrate 10. Parts of the active layer 20, externally exposed on the upper and lower portions 11, 12 of the substrate 10, are respectively formed as impurity regions. In addition, an additional insulation film (not shown) is formed on the upper and lower portions 11, 12, and on the sidewall 13.

The substrate 10 may be formed of an insulating material or an insulation film provided on a semiconductor material.

The active layer 20 is a semiconductor film, and the insulation film 41 is formed of a spin-on-glass (SOG). Also, the active layer 20 is provided with a channel region (b) and an offset region (c) corresponding to the gate electrode 42 and insulation film 41, respectively.

FIGS. 3A–3H are vertical cross-sectional diagrams sequentially illustrating a method of fabricating the thin film transistor according to the present invention.

Figure 3A:
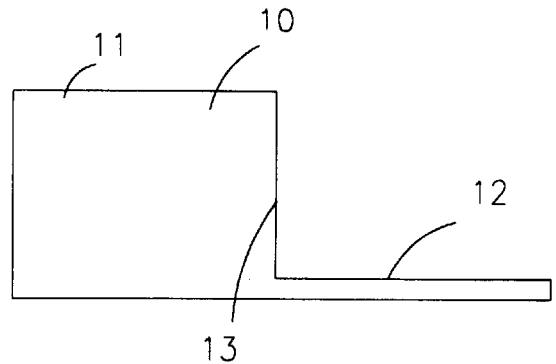
FIGS. 3A–3H are vertical cross-sectional diagrams sequentially illustrating a method of fabricating the thin film transistor according to the present invention.

In FIG. 3A, the substrate 10 is etched and patterned, and thereby has the sidewall 13 provided between the upper and lower portions 11, 12 thereof. Here, the substrate 10 is formed of an insulating material or an insulation film which is provided on a semiconductor material, and an additional insulation film (not shown) is formed on the upper and lower portions 11, 12, and sidewall 13 of the substrate 10.

Figure 3B:
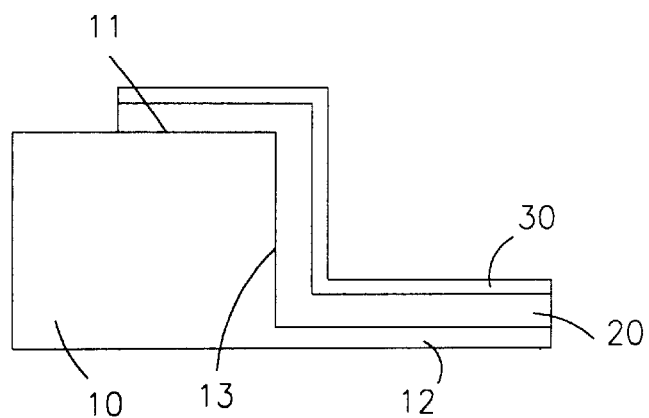

In FIG. 3B, the active layer 20 is deposited on the above described substrate 10 by CVD, and the gate insulation film 30 is formed on the active layer 20. Here, the active layer 20 is formed of a semiconductor film, and the gate insulation film 30 is formed by oxidizing the active layer 20, or by CVD.

Figure 3C:
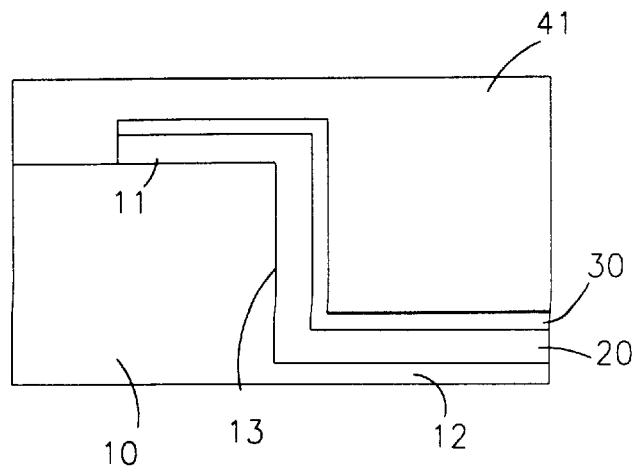

The insulation film 41 formed of an SOG is deposited on the resultant structure, including the gate insulation film 30, as shown in FIG. 3C.

Figure 3D:
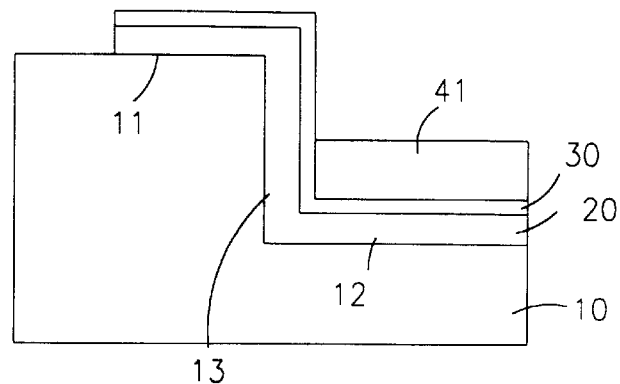

As shown in FIG. 3D, after an etch-back process, a part of the insulation film 41 remains on the gate insulation film 30 formed on the lower portion 12 of the substrate 10, being formed to the lower part of the sidewall 13 of the substrate 10.

Figure 3E:
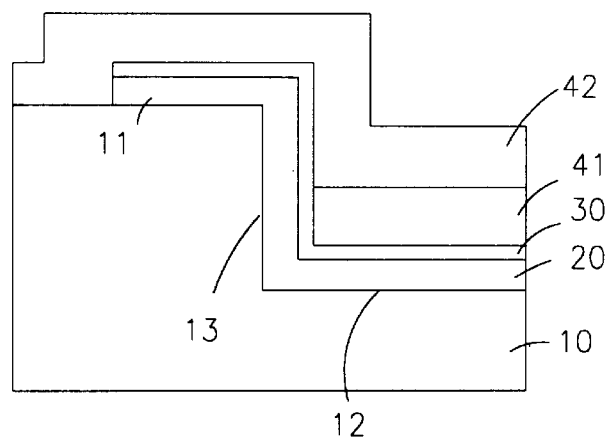

In FIG. 3E, the gate electrode conductive film 42 is deposited on the resultant structure 10 including the gate insulation film 30 and insulation film 41. Here, doped polysilicon is applied as the material of the gate electrode conductive film 42, and the lower part of the sidewall 13 of the substrate 10, corresponding to the insulation film 41, is defined as a first region, and the upper portion of the sidewall 13 of the substrate 10 corresponding to the gate electrode conductive film 42, is defined as a second region.

Figure 3F:
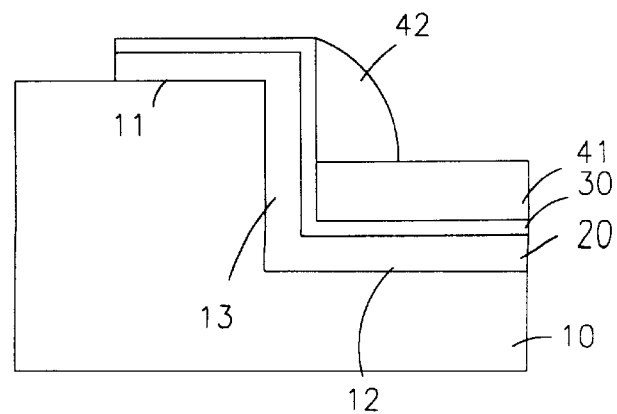

In FIG. 3F, an anisotropic etching process is applied to the gate electrode conductive film 42, thus forming the gate electrode 42, and a conductive sidewall formed to the gate insulation film 30 corresponding to the upper part of the sidewall 13 of the substrate 10.

Figure 3G:
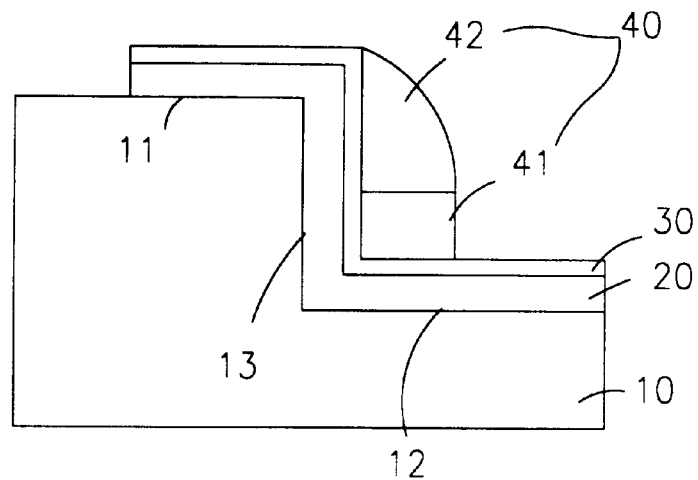

As shown in FIG. 3G, the insulation film 41 is etched by utilizing the gate electrode 42 as an etching mask.

Figure 3H:
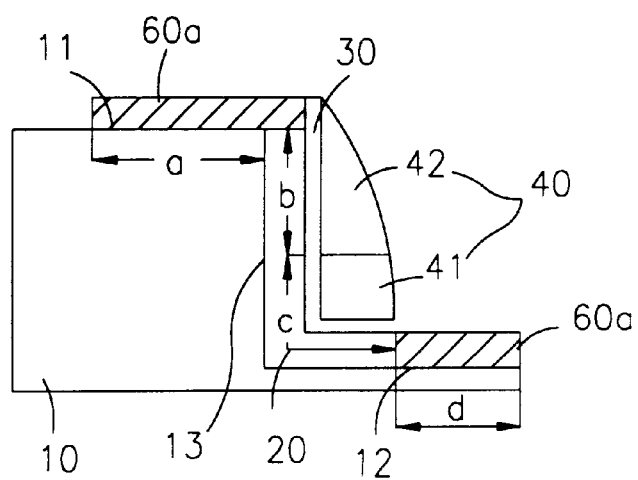

In FIG. 3H, by using the gate electrode 42 and insulation film 41 as a mask, ion implantation, applying As, P, etc., is performed into portions of the active layer 20 corresponding to the upper and lower portions 11, 12 of the substrate 10, for thus defining a source and a drain impurity regions of an NMOS transistor, or an ion implantation, applying B, BF$_3$, etc., is performed thereinto, for thus defining a source and a drain impurity regions of a PMOS transistor. By the above described method, the thin film transistor according to the present invention can be fabricated. Here, a, b, c and d in FIG. 3H indicate the source, channel region, offset region, and drain, respectively.

As described above, in the thin film transistor according to the present invention the impurity regions are formed by a self-aligned process, and the length of each of the channel and offset regions is defined in accordance with the thicknesses of each of the gate electrode and the insulation film, respectively, for thereby controlling the offset current to be more stabilized and accordingly for being capable of improving the reliability and reproducibility of the semiconductor device.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. A method of fabricating a thin film transistor, comprising the steps of:

patterning and etching a substrate in order to form a sidewall between upper and lower portions of the substrate;

forming an active layer on the upper portion, lower portion and sidewall of the substrate;

forming a gate insulation film on the active layer;

forming an insulation film on a first region of the sidewall and on the lower portion of the substrate, and forming a gate electrode on a second region of the sidewall and on the insulation film wherein a portion of the active layer corresponding to the gate electrode is a channel region, and a portion thereof corresponding to the insulation film is an offset region; and forming impurity regions in the active layer corresponding to the upper and lower portions of the substrate.

2. The method of claim 1, wherein the substrate is an insulating material.

3. The method of claim 1, wherein the active layer is a semiconductor film.

4. The method of claim 1, wherein the insulation film is an SOG (spin-on2 glass).

5. The method of claim 1, wherein the step of forming the gate electrode and insulation film comprises the sub-steps of:

forming the insulation film on the lower portion of the substrate;

forming a conductive film on the upper portion and on the sidewall of the substrate, and on the insulation film;

forming a conductive sidewall on the sidewall of the substrate by applying an anisotropic etching process to the conductive film; and etching the insulation film by using the conductive side wall as an etching mask.

6. The method of claim 5, wherein the conductive film is a polysilicon layer.

* * * * *